(12) United States Patent
Jo

(10) Patent No.: US 11,268,189 B2
(45) Date of Patent: Mar. 8, 2022

(54) METHOD OF MANUFACTURING TANTALUM CARBIDE COATING LAYER USING CHEMICAL VAPOR DEPOSITION AND TANTALUM CARBIDE MANUFACTURED USING THE SAME

(71) Applicant: TOKAI CARBON KOREA CO., LTD, Gyeonggi-do (KR)

(72) Inventor: Dong Wan Jo, Anseong-si (KR)

(73) Assignee: TOKAI CARBON KOREA CO., LTD, Anseong-Si (KR)

( * ) Notice: Subject to any disclaimer, the term of this patent is extended or adjusted under 35 U.S.C. 154(b) by 39 days.

(21) Appl. No.: 16/224,284

(22) Filed: Dec. 18, 2018

(65) Prior Publication Data

US 2019/0185995 A1   Jun. 20, 2019

(30) Foreign Application Priority Data

Dec. 19, 2017   (KR) .................. 10-2017-0174936

(51) Int. Cl.
    *C23C 16/32*   (2006.01)
    *C01B 32/914*  (2017.01)
    *C23C 16/04*   (2006.01)
    *C23C 16/52*   (2006.01)
    *C23C 16/44*   (2006.01)

(52) U.S. Cl.
    CPC ............ *C23C 16/32* (2013.01); *C01B 32/914* (2017.08); *C23C 16/045* (2013.01); *C23C 16/4401* (2013.01); *C23C 16/52* (2013.01)

(58) Field of Classification Search
    CPC ........................... C23C 16/32; C01B 32/914
    USPC ...................................... 427/249.17
    See application file for complete search history.

(56) References Cited

U.S. PATENT DOCUMENTS

2012/0040172 A1   2/2012  Fujiwara et al.
2012/0301723 A1*  11/2012  Kondo ................... C23C 8/20
                                                    428/408

FOREIGN PATENT DOCUMENTS

| CN | 205152327 U | 4/2016 |
| EP | 3 617 174 | 4/2020 |
| EP | 18211933.9 | 3/2021 |
| JP | 10-245285 | 9/1998 |
| JP | 2004/134741 | 4/2004 |
| JP | 2011-153070 | 8/2011 |
| JP | 2018-236460 | 12/2019 |
| KR | 2012-0104260 | 9/2012 |
| KR | 2017/0133191 | 12/2017 |

OTHER PUBLICATIONS

Machine translation for KR 20170133191 (Year: 2017).*
Machine translation CN205152327 (Year: 2016).*
Long, Y. et al., "The effect of deposition temperature on the microstructure and mechanical properties of TaC coatings", Materials Letters, vol. 121, pp. 202-205, (2014).
Extended European Search Report dated Apr. 16, 2019 for EP application No. 18211933.9, 10 pages.

* cited by examiner

*Primary Examiner* — Elizabeth A Burkhart
(74) *Attorney, Agent, or Firm* — Evan Law Group LLC

(57) ABSTRACT

A method of manufacturing a material including tantalum carbide (TaC) with a particularly low impurity content, and a TaC material formed by the method are provided. The method includes preparing a base material, and forming a TaC coating layer on a surface of the base material at a temperature of 1,600° C. to 2,500° C.

4 Claims, 4 Drawing Sheets

METHOD OF MANUFACTURING TANTALUM CARBIDE COATING LAYER USING CHEMICAL VAPOR DEPOSITION AND TANTALUM CARBIDE MANUFACTURED USING THE SAME

CROSS-REFERENCE TO RELATED APPLICATION

This application claims the benefit of Korean Patent Application No. 10-2017-0174936, filed on Dec. 19, 2017, in the Korean Intellectual Property Office, the disclosure of which is incorporated herein by reference.

BACKGROUND

1. Field of the Invention

One or more example embodiments relate to a method of manufacturing a material including tantalum carbide (TaC) with a particularly low impurity content, and a TaC material formed by the method.

2. Description of the Related Art

Research for enhancing a wear resistance and a corrosion resistance of a material, and the like, by introducing a thin film made of various types of materials onto a surface of a base material has been conducted in various fields. In particular, tantalum carbide (TaC) coating is attracting attention because the TaC coating has excellent features in terms of a heat resistance, a wear resistance and a plasma etching resistance in comparison to existing thin film materials. Recently, a TaC-coated carbon material in which a TaC coating layer is formed on a carbon material is being used in various industrial fields, such as a member of semiconductor single crystal manufacturing apparatus, a precision machine tool, and parts for engines.

The formed TaC coating layer has often been an issue in an adhesion to a base metal. Accordingly, recently, a variety of research is being conducted on a TaC thin film coating method for increasing an adhesion onto a carbon base material while maintaining a relatively high surface hardness.

Also, research is being conducted on methods of securing a TaC material from a TaC coating layer formed as described above and utilizing the TaC material as a separate and independent material.

Recently, attention is being focused on a technology of controlling physical properties, such as a hardness or a surface wear resistance, of a coating layer containing TaC to enhance a corrosion resistance and a wear resistance. An amount of impurities contained in the TaC has been a hindrance to realizing inherent characteristics of the TaC, such as a high corrosion resistance and a high wear resistance. Thus, research has been conducted on a process of removing impurities from the TaC after the TaC is manufactured, but an additional process is required, which results in lowering a productivity of a product.

SUMMARY

Example embodiments provide a method of manufacturing a tantalum carbide (TaC) material with a low impurity content, to properly realize inherent physical properties of TaC even though a particular additional process is not performed. The TaC material may have excellent physical properties and a high hardness and may be excellent in an adhesion to a carbon base material.

However, the problems to be solved in the present disclosure are not limited to the foregoing problems, and other problems not mentioned herein would be clearly understood by one of ordinary skill in the art from the following description.

According to an aspect, there is provided a method of manufacturing a TaC material with a low impurity content, the method including preparing a base material, and forming a TaC coating layer on a surface of the base material at a temperature of 1,600° C. to 2,500° C.

The method of claim 1, wherein the forming of the TaC coating layer comprises forming the TaC coating layer by spraying a mixture of a tantalum (Ta) precursor and a carbon (C) precursor or each of the Ta precursor and the C precursor onto the base material using a chemical vapor deposition (CVD).

The Ta precursor and the C precursor may be in a gas phase or a solid phase.

The preparing of the base material may include preparing a base material having a coefficient of expansion of $4.0 \times 10^{-6}/°$ C. to $7.0 \times 10^{-6}/°$ C.

The preparing of the base material may include preparing a base material with a porous structure. The forming of the TaC coating layer may include forming a TaC-impregnated region in the base material by impregnating TaC into pores of the surface of the base material.

According to another aspect, there is provided a TaC material including a base material, and a TaC coating layer, wherein the TaC coating layer includes components other than Ta and C in an amount of 1,200 ppm or less.

The TaC material may be manufactured by the method.

A sum of concentrations of transition metals and chlorine (Cl) impurity elements belonging to Group 4, Group 5 and Group 6 of the periodic table may range from 1 ppm to 1,000 ppm.

A sum of concentrations of impurity elements that do not belong to Group 4, Group 5 and Group 6 of the periodic table may range from 1 ppm to 7 ppm.

The TaC material may have a surface hardness of 15 GPa or greater.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
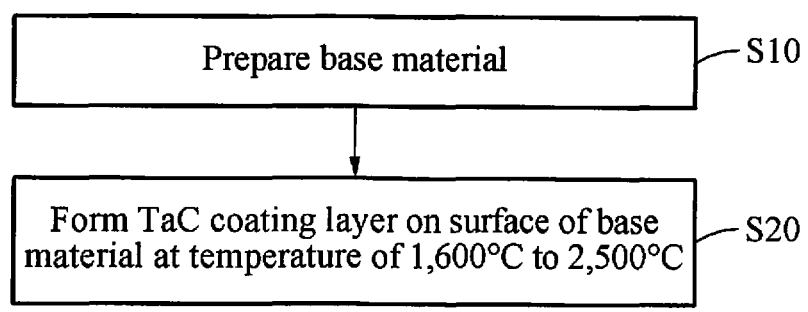
FIG. 1 is a flowchart illustrating a method of manufacturing a tantalum carbide (TaC) material with a low impurity content according to an example embodiment.

Hereinafter, a method of manufacturing a tantalum carbide (TaC) material and a TaC material will be described in detail with reference to example embodiments and drawings. Various alterations and modifications may be made to the example embodiments and drawings. When describing the example embodiments with reference to the accompanying drawings, like reference numerals refer to like elements, and a repeated description related thereto will be omitted. Here, the following example embodiments are not construed as limited to the disclosure and should be understood to include all changes, equivalents, and replacements within the idea and the technical scope of the disclosure. When it is determined detailed description related to a related known function or configuration they may make the purpose of the present disclosure unnecessarily ambiguous in describing the present disclosure, the detailed description will be omitted here.

Also, terms used herein are defined to appropriately describe the example embodiments and thus may be changed depending on a user, the intent of an operator, or a custom of a field to which the present disclosure pertains. Accordingly, the terms must be defined based on the following overall description of this specification. Like reference numerals present in the drawings refer to the like elements throughout.

It will be understood throughout the whole specification that when a component is referred to as being "on" another component, the component can be directly on another component or an intervening component between the two components.

Also, it will be understood throughout the whole specification that, unless specified otherwise, when one part "includes" or "comprises" one component, the part does not exclude other components but may further include the other components.

Generally, in a process of forming a TaC material, a degree to which a purity of TaC to be formed may be increased, which base material is to be used in a process of forming a TaC material using a chemical vapor deposition (CVD), or whether to use a base material coated with a TaC material or use a base material separately from a TaC material may be designed in advance.

To solve the above various problems, example embodiments provide a method of manufacturing a TaC material with an enhanced corrosion resistance and wear resistance by increasing a purity of TaC, and provide a TaC material that may be applied onto a base material or may be used separately from the base material.

Although TaC is mainly described in example embodiments, NbC, ZrC and HfC may also be manufactured to have a low impurity content using a similar process by simply changing gas to be injected.

According to an example embodiment, a method of manufacturing a TaC material with a low impurity content may be provided.

FIG. 1 is a flowchart illustrating a method of manufacturing a TaC material with a low impurity content according to an example embodiment. Each of steps of the method of FIG. 1 is described in detail below.

The method includes step S10 of preparing a base material, and step S20 of forming a TaC coating layer on a surface of the base material at a temperature of 1,600° C. to 2,500° C. The TaC coating layer may include all materials that contain tantalum (Ta) and carbon (C) as main components.

In a process of manufacturing a TaC material, a TaC coating layer may be formed on a base material, to form a TaC material. In step S20, the TaC coating layer may be formed at a high temperature, for example, a temperature of 1,600° C. or greater, thereby minimizing an amount of impurities included in the TaC coating layer.

For example, when a TaC coating layer is formed at a temperature of 1,600° C. or greater, all impurities with a low melting point may be removed. Thus, an effect of securing a high-quality TaC material may be obtained. A TaC material with a high purity secured as described above may be effectively utilized in semiconductor and epitaxial processes. When a large amount of impurities remain in the TaC coating layer, a defect may occur and a doping concentration may be affected by the impurities, thereby finally having an influence on physical properties to be realized with TaC.

In step S20, the TaC coating layer may be formed by spraying a mixture of a Ta precursor and a C precursor or each of the Ta precursor and the C precursor onto the base material using a CVD.

A step of forming the TaC coating layer by spraying additional gas required in a CVD process, for example, hydrogen gas or inert gas, other than the Ta precursor and the C precursor may be performed.

The Ta precursor and the C precursor may be in a gas phase or a solid phase.

For example, when the TaC coating layer is formed using the CVD in step S20, a heat treatment step may be additionally performed at a temperature of 1,600° C. or greater. In this example, a TaC coating layer formed by performing the heat treatment step may be stabilized and impurities may be additionally removed, thereby securing a TaC material with a higher purity.

A temperature of the heat treatment step may be 2,200° C. or less. Desirably, the temperature of the heat treatment step may be 2,000° C. or less.

For example, an average porosity of the base material may be in a range from 5 vol % to 20 vol %, a range from 70 vol % to 90 vol %, or one of the ranges may be selected and used depending on a required use. When the average porosity is excessively low, a TaC coating layer may not be effectively formed on the base material, or a problem of a separation of the TaC coating layer from the base material during a formation of the TaC coating layer or a problem of a low surface hardness may occur. When the average porosity is excessively high, a durability of the base material may decrease, a surface roughness may increase, or a rough surface of the TaC coating layer may be formed.

Figure 2:
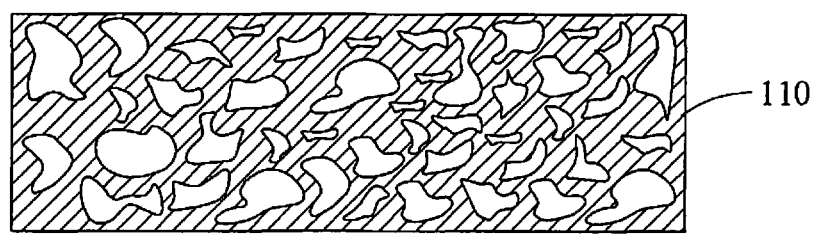
FIG. 2 is a cross-sectional view illustrating an available base material with a porous structure according to an example embodiment.

FIG. 2 is a cross-sectional view illustrating an available base material 110 with a porous structure according to an example embodiment.

A carbon base material may include, for example, a base material, such as graphite, containing carbon as a main component. When a TaC coating layer is formed on the carbon base material, TaC may be impregnated into pores of the carbon base material to form a TaC-impregnated region.

Figure 3:
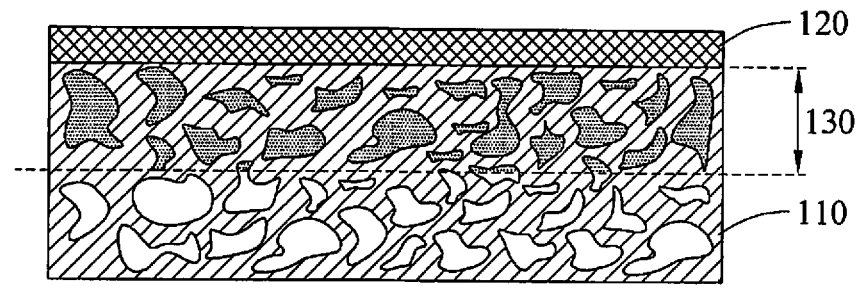
FIG. 3 is a cross-sectional view illustrating a structure in which TaC is impregnated into a base material with a porous structure, in which a TaC coating layer is formed on a surface of the base material and in which a TaC-impregnated region is formed in the base material according to an example embodiment.

FIG. 3 is a cross-sectional view illustrating a structure in which TaC is impregnated into a base material 110 with a porous structure, in which a TaC coating layer 120 is formed on a surface of the base material 110 and in which a TaC-impregnated region 130 is formed in the base material 110 according to an example embodiment.

In step S10 of FIG. 1, a base material having a coefficient of expansion of 4.0×10$^{-6}$/° C. to 7.0×10$^{-6}$/° C. may be prepared.

The coefficient of expansion of the base material may be an important factor in determining an adhesion between the base material and a TaC coating layer formed on the base material. For example, when a base material with a coefficient of expansion that is not greatly different from a coefficient of expansion of TaC is prepared based on a coefficient of expansion of a TaC coating layer, the TaC coating layer and the base material may be firmly bonded. In this example, the base material may have a coefficient of expansion of 4.0×10$^{-6}$/° C. to 7.0×10$^{-6}$/° C. Thus, thermal stress with the carbon base material may be minimized when expansion or contraction occurs due to a temperature change of a coating layer including TaC, and an adhesiveness of the TaC coating layer may be effectively enhanced. Also, the TaC coating layer may be stably formed on the base material.

In step S10 of FIG. 1, a base material with a porous structure may be prepared. In step S20 of FIG. 1, a TaC-impregnated region may be formed in the base material by impregnating TaC into pores of the surface of the base material.

According to an example embodiment, a TaC material with a low impurity content may be provided.

The TaC material with the low impurity content may include a base material, and a TaC coating layer. The TaC coating layer may include a component other than Ta and C in an amount of 1,200 ppm or less.

The TaC material may be manufactured by the method of FIG. 1.

For example, impurities may flow from a hot zone or a raw material pipe using raw materials such as Ta and C.

Impurities including elements other than Ta and C may be included in the TaC coating layer, which may result in a defect in a formation as a semiconductor material, or a problem of a total composition content when a dopant is added, thereby ultimately leading to a problem of reducing a performance of a product.

The TaC coating layer may be formed at a high temperature, for example, a temperature of 1,600° C. or greater, and thus impurities with a low melting point may be removed even though a separate additional process is not performed in a process of forming a coating layer.

A ratio of a diffraction peak value of a (200) plane to a diffraction peak value of a (111) plane in an x-ray diffraction (XRD) analysis may be 0.17 or less.

A surface hardness value of a TaC coating layer including the TaC material tends to gradually decrease when a ratio of diffraction peak values between a (111) plane and a (200) plane of the TaC coating layer increases. When the ratio of the diffraction peak values increases, a width of a decrease in the surface hardness value of the TaC coating layer including TaC may gradually increase.

When the ratio of the diffraction peak values exceeds 0.17, the surface hardness of the TaC coating layer may decrease, and accordingly it may be difficult to use for a semiconductor manufacturing device that requires a coating layer requiring a material with a high surface hardness. Also, an adhesion between the TaC coating layer and the base material may decrease, and a grain boundary that forms a boundary between crystal grains may increase, thereby reducing a homogeneity of a material. Even though the ratio of the diffraction peak values slightly increases after exceeding 0.17, the surface hardness value may greatly decrease. Thus, the ratio of 0.17 may correspond to a value having meaning in terms of an example embodiment, and a coating layer including TaC with the ratio of 0.17 or less may become an important factor in realizing a high surface hardness value of a carbon material.

Also, the ratio of the diffraction peak value of the (200) plane to the diffraction peak value of the (111) plane may be 0.01 or greater.

The (111) plane may have a maximum peak value among peak values in the XRD analysis.

For example, a half width of a diffraction line in the XRD analysis may be 0.15 degrees or less.

Thus, it is possible to form a coating layer including TaC formed to have a sufficiently large average size of TaC crystal grains with a high crystallinity.

For example, crystal grains may have an average crystal grain size of 10 μm to 50 μm.

When the average crystal grain size is less than 10 μm, a hardness of a coating layer including TaC may be less than a predetermined level, and accordingly it may be difficult to apply the coating layer to a semiconductor manufacturing device that typically requires a material with a high hardness. When the average crystal grain size exceeds 50 μm, energy and costs in a process required to increase a crystal grain size may greatly increase, thereby lowering a productivity of a production.

A sum of concentrations of transition metals and chlorine (Cl) impurity elements belonging to Group 4, Group 5 and Group 6 of the periodic table may range from 1 ppm to 1,000 ppm.

A sum of concentrations of impurity elements that do not belong to Group 4, Group 5 and Group 6 of the periodic table may range from 1 ppm to 7 ppm.

The TaC material may have a surface hardness of 15 GPa or greater.

Thus, it is possible to secure a high surface hardness of the TaC material.

Hereinafter, the present disclosure will be described in detail with reference to to examples and comparative examples. However, the technical idea of the present disclosure is not limited or restricted to the examples and comparative examples.

EXAMPLES

A plurality of TaC materials including a TaC coating layer provided according to an example embodiment were manufactured using a CVD.

According to an example embodiment, carbon base materials with an average porosity of 15 vol % or greater were prepared, TaCl$_5$ was used as Ta precursor gas and hydrocarbon was used as C precursor gas under a CVD treatment condition, that is, a temperature of 1,600° C. (in particular, 2,000° C.) to 2,500° C., to form a TaC coating layer. A composition ratio of C/Ta of the TaC coating layer was adjusted to 1.1:1. An average porosity of each of the carbon base materials was measured by a mercury adsorption scheme.

(1) Confirmation of Amount of Impurities Included in TaC Coating Layer

Two TaC materials with a low impurity content were manufactured under the above conditions (Examples 1 to 4).

Tables 1 and 2 show a type and an amount of impurities included in the TaC materials of Examples 1 to 4.

TABLE 1

(Unit: ppm)

| Type | | Elements | Example 1 | Example 2 | Example 3 | Example 4 |
|---|---|---|---|---|---|---|
| Transition metals | Group Ti | Ti | 6 | 0.93 | 4.2 | 0.4 |
| | | Zr | — | 0.1 | 1.1 | — |
| | | Hf | — | — | — | — |
| | Group V | V | 29 | 0.08 | 0.16 | 0.12 |
| | | Nb | 0.71 | 8.1 | 7.2 | 6.6 |
| | | Ta | Matrix | Matrix | Matrix | Matrix |
| | Group Cr | Cr | — | — | — | — |
| | | Mo | 0.85 | 45 | 180 | 670 |
| | | W | 0.85 | 40 | 38 | 13 |
| Halogen | | Cl | 30 | 30 | 30 | 29 |
| | | Sum | 67.41 | 124.21 | 260.66 | 719.12 |

Elements that are not shown in Table 1 correspond to materials that are not detected on data during a glow discharge mass spectrometry (GDMS). Since indium (In) is used as a binder in the GDMS, In was excluded from the impurities of Table 1.

Based on results of Examples 1 to 4 as shown in Table 1, it is confirmed that a sum of concentrations of transition metals that have a melting point of 1,600° C. or greater and that belong to Group 4 (titanium (Ti)-based elements), Group 5 (vanadium (V)-based elements) and Group 6 (chromium (Cr)-based elements) of the periodic table ranges from 1 ppm to 1,000 ppm.

TABLE 2

(Unit: ppm)

| Elements | Example 1 | Example 2 | Example 3 | Example 4 |
|---|---|---|---|---|
| B | — | 0.11 | 0.05 | 0.03 |
| Na | 0.03 | 0.35 | 0.08 | 0.13 |
| Al | — | 0.12 | 0.06 | 0.15 |
| Si | 0.98 | 1.1 | 0.95 | 0.44 |
| K | — | 0.98 | 0.41 | 0.56 |
| S | 0.25 | 0.13 | 0.08 | 0.25 |
| Ca | — | 0.59 | 0.54 | 0.47 |
| Fe | 1.6 | 2.8 | 2.9 | 2.2 |
| Ni | — | 0.11 | 0.13 | 0.1 |
| Zn | 0.36 | 0.21 | 0.11 | 0.36 |
| Total | 3.22 | 6.5 | 5.31 | 4.69 |

Also, it is confirmed that a sum of concentrations of impurity elements that do not belong to Group 4, Group 5 and Group 6 of the periodic table ranges from 1 ppm to 7 ppm. It is confirmed that impurity elements that are not shown in Table 2 were not detected during a GDMS or were detected below a detection range.

(2) Confirmation of Relationship Between Surface Hardness and Ratio of Peak Values in XRD Analysis The plurality of TaC materials were manufactured according to examples using the method according to an example embodiment, with different ratios of a diffraction peak value of a (200) plane of a coating layer including TaC formed under the above conditions to a diffraction peak value of a (111) plane of the coating layer. Also, for comparison with the TaC materials, a TaC material was manufactured according to Comparative Example 1 that is not included in the scope of the present disclosure. A surface hardness of each of the TaC materials was measured.

Table 3 shows a correlation between a surface hardness and a ratio of peak values between the (200) plane and the (111) plane measured for Examples 5 and 6 and Comparative Example 1.

TABLE 3

| | Ratio of peak values of (200) plane/(111) plane | Surface hardness (GPa) |
|---|---|---|
| Comparative Example 1 | 0.76 | 2.64 |
| Example 5 | 0.17 | 16.31 |
| Example 6 | 0.07 | 16.78 |

Based on experimental results, it is confirmed that based on the ratio of 0.17, a value of the surface hardness greatly changes. In other words, it is confirmed that when the ratio is 0.17 or less, a value of a surface hardness of a coating layer including TaC is 16 GPa or greater that indicates a high hardness, and that when the ratio exceeds 0.17, the value of the surface hardness greatly decreases even though the ratio increases slightly only. Also, it is confirmed that when the ratio gradually decreases from 0.1, a rate of an increase in the value of the surface hardness gradually decreases.

Also, based on the experimental results, it is confirmed that a correlation of a quadratic function is established between the ratio and the value of the surface hardness, with the ratio as a variable and including all values of the surface hardness within a predetermined error range.

Figure 4A:
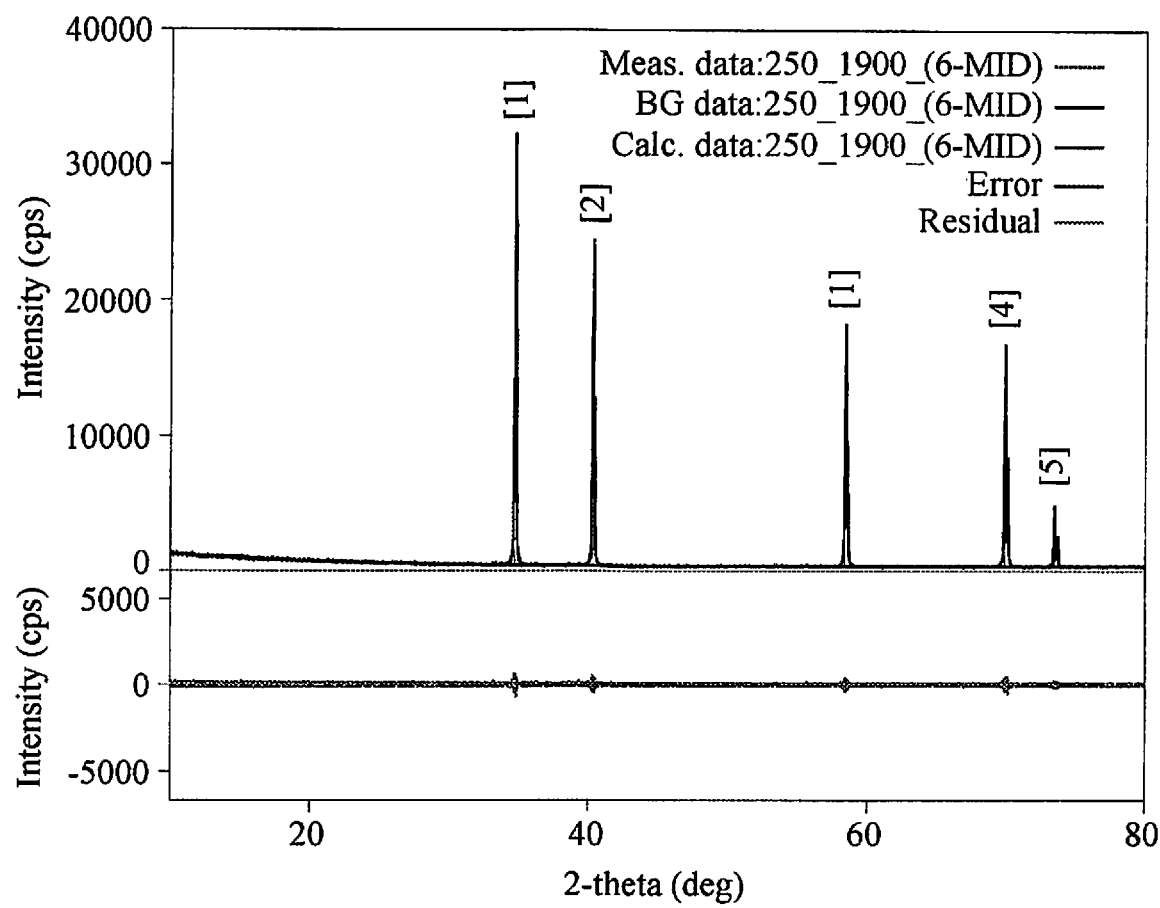
FIGS. 4A, 4B and 4C are graphs illustrating experimental results of an x-ray diffraction (XRD) analysis of TaC materials manufactured according to examples and comparative examples according to an example embodiment.
Figure 4B:
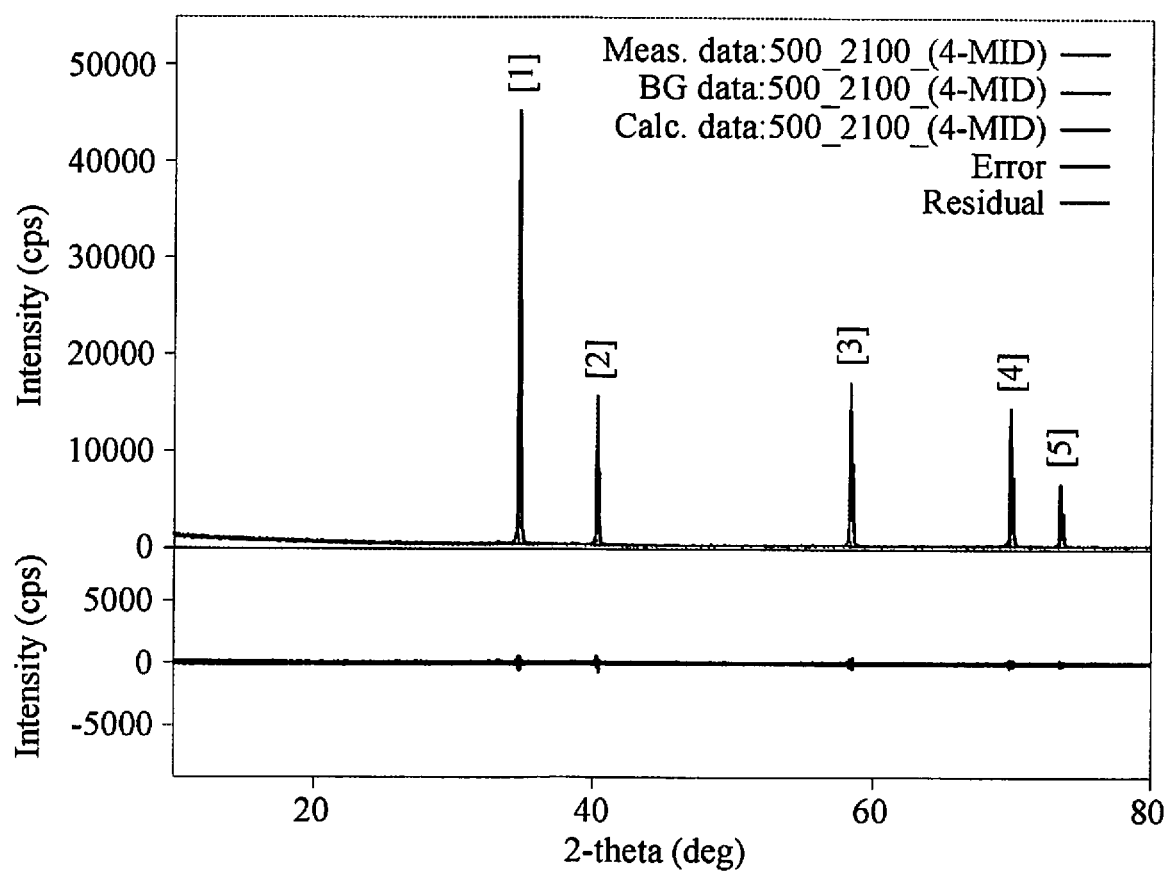
Figure 4C:
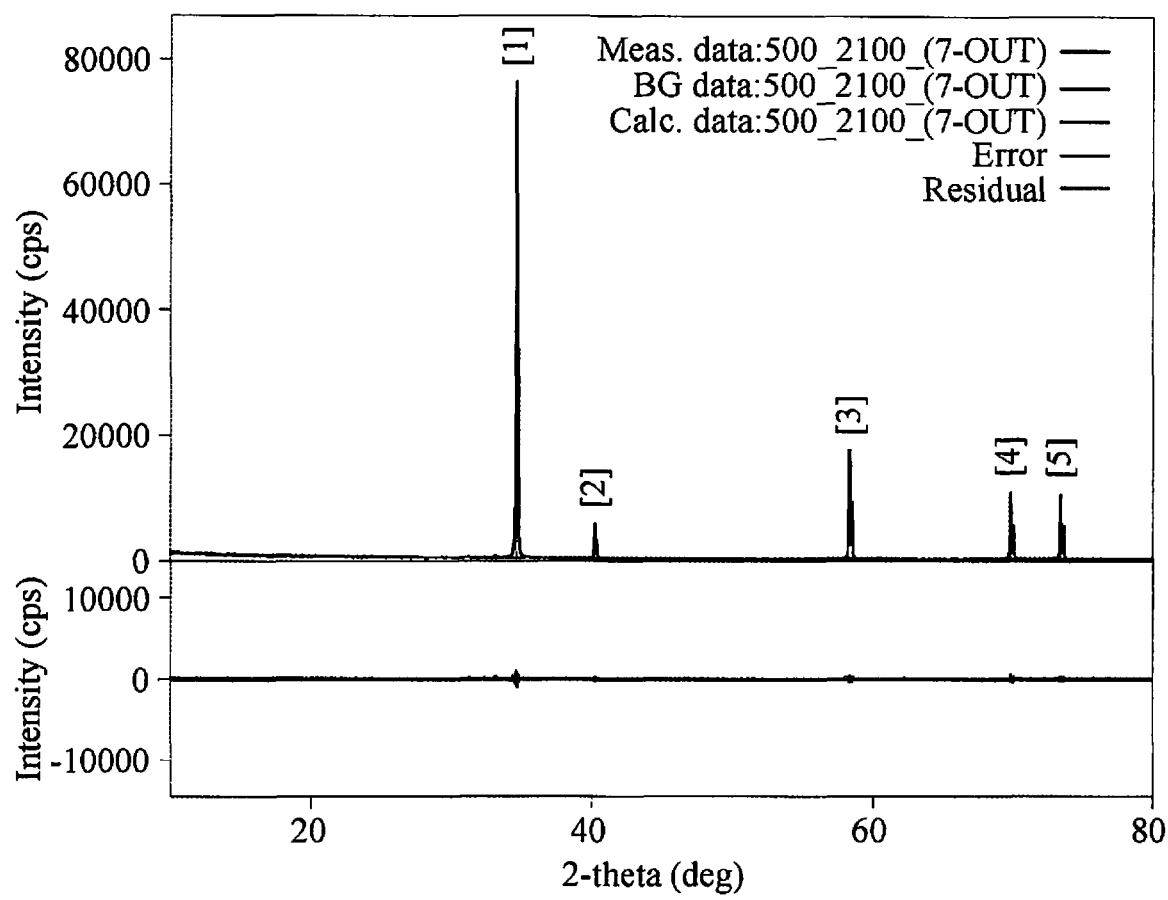

FIGS. 4A, 4B and 4C are graphs illustrating experimental results of an XRD analysis of coating layers including TaC manufactured according to examples and comparative examples according to an example embodiment. In each of the graphs, a peak [1] indicates a peak of a (111) plane and a peak [2] indicates a peak of a (200) plane.

FIG. 4A illustrate experimental results of an XRD analysis of a coating layer including TaC of Comparative Example 1, FIG. 4B illustrate experimental results of an XRD analysis of a coating layer including TaC of Example 5, and FIG. 4C illustrate experimental results of an XRD analysis of a coating layer including TaC of Example 6.

(3) Confirmation of Relationship Between Surface Hardness and Average Crystal Grain Size of Coating Layer including TaC To confirm a relationship between a surface hardness and an average crystal grain size of a coating layer including TaC under the above conditions, TaC materials with different average crystal grain sizes were manufactured according to a plurality of examples and a comparative example. A surface hardness of each of the TaC materials was measured.

The average crystal grain size was measured based on an ASTM E112 that is a standard test method of determining an average crystal grain size.

Table 4 shows average crystal grain sizes and values of a surface hardness measured for Examples 7 to 10 according to an example embodiment and Comparative Example 2.

TABLE 4

| | Average crystal grain size (μm) | Surface hardness (GPa) |
|---|---|---|
| Comparative Example 2 | 6.1 | 2.64 |
| Example 7 | 11.2 | 15.36 |
| Example 8 | 11.6 | 16.31 |
| Example 9 | 17.5 | 16.11 |
| Example 10 | 20.1 | 16.78 |

Based on results of Table 4, it is confirmed that when the average crystal grain size increase to be a predetermined level or greater, the value of the surface hardness greatly increases.

According to example embodiments, it is possible to provide a TaC material that contains a trace amount of impurities and that has an excellent adhesion and a high hardness. The TaC material may not require a separate impurity purification process due to a low impurity content. Also, inherent physical properties of the original TaC may be realized without a change, and thus it is possible to secure a material in which higher corrosion resistance and wear resistance are realized.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A tantalum carbide (TaC) material comprising:
a base material; and
a TaC coating layer,
wherein the TaC coating layer comprises components other than tantalum (Ta) and carbon (C) in an amount of 1,200 ppm or less,
the TaC coating layer has a ratio of a diffraction peak value of a (200) plane to a diffraction peak value of a (111) plane in an X-ray diffraction (XRD) analysis of 0.17 or less,
the TaC coating layer has a half width of a diffraction line in the XRD analysis of 0.15 degrees or less,
the TaC coating layer comprises crystal grains, and the crystal grains have an average crystal grain size of 10 μm to 50 μm,
the (111) plane has a maximum peak value among peak values in the XRD analysis, and
the TaC material has a surface hardness of 15 GPa or greater.

2. The TaC material of claim 1, wherein the TaC material is manufactured by a method comprising:
preparing a base material; and
forming a TaC coating layer on a surface of the base material at a temperature of 1,600° C. to 2,500° C.

3. The TaC material of claim 1, wherein a sum of concentrations of transition metals and chlorine (Cl) impurity elements belonging to Group 4, Group 5 and Group 6 of the periodic table ranges from 1 ppm to 1,000 ppm.

4. The TaC material of claim 1, wherein a sum of concentrations of impurity elements that do not belong to Group 4, Group 5 and Group 6 of the periodic table ranges from 1 ppm to 7 ppm.

* * * * *